United States Patent [19]
Tsurushima

[11] Patent Number: 5,741,410
[45] Date of Patent: Apr. 21, 1998

[54] APPARATUS FOR FORMING SPHERICAL ELECTRODES

[75] Inventor: Kuniaki Tsurushima, Kanagawa-ken, Japan

[73] Assignee: Kabushiki Kaisha Toshiba, Kawasaki, Japan

[21] Appl. No.: 568,281

[22] Filed: Dec. 6, 1995

[30] Foreign Application Priority Data

Dec. 6, 1994 [JP] Japan ................................. 6-302227

[51] Int. Cl.$^6$ ............................. C25D 17/06; B25B 11/00
[52] U.S. Cl. ................................. 204/297 M; 269/21
[58] Field of Search ........................... 204/297 R, 297 M, 204/297 W; 269/21

[56] References Cited

U.S. PATENT DOCUMENTS

| | | | |
|---|---|---|---|
| 4,428,815 | 1/1984 | Powell et al. | 269/21 X |
| 5,194,105 | 3/1993 | Nguyen | 269/21 X |
| 5,342,495 | 8/1994 | Tung et al. | 204/297 M |
| 5,522,975 | 6/1996 | Andricacos et al. | 204/297 R |

OTHER PUBLICATIONS

Sulich, "Wafer Holder for Electrodeposition of Contact Metallurgy", Oct. 1972, IBM Tech. Disc. Bulletin.

Primary Examiner—Donald R. Valentine
Attorney, Agent, or Firm—Banner & Witcoff, Ltd.

[57] ABSTRACT

The present invention relates to a method and apparatus for forming ball electrodes on electrode pads provided on a package. Solder balls and the electrode pads can be aligned with each other with high precision, and the cost of processing can be decreased. An installation apparatus for balls which holds the solder balls by vacuum suction is preferably formed of heat-resisting glass or other transparent material through which the balls may be observed. The solder balls are aligned with electrode pads provided on a package, and brought into contact with the electrode pads, with the solder balls and the electrode pads capable of being viewed through the installation apparatus from the top. Thereafter, a light beam is radiated from a light beam radiation light through the installation apparatus, thereby successively melting soldering paste on the electrode pads. In such a manner, the solder balls are fixed to the electrode pads. Consequently, ball electrodes are precisely formed.

7 Claims, 6 Drawing Sheets

*FIG. 5*
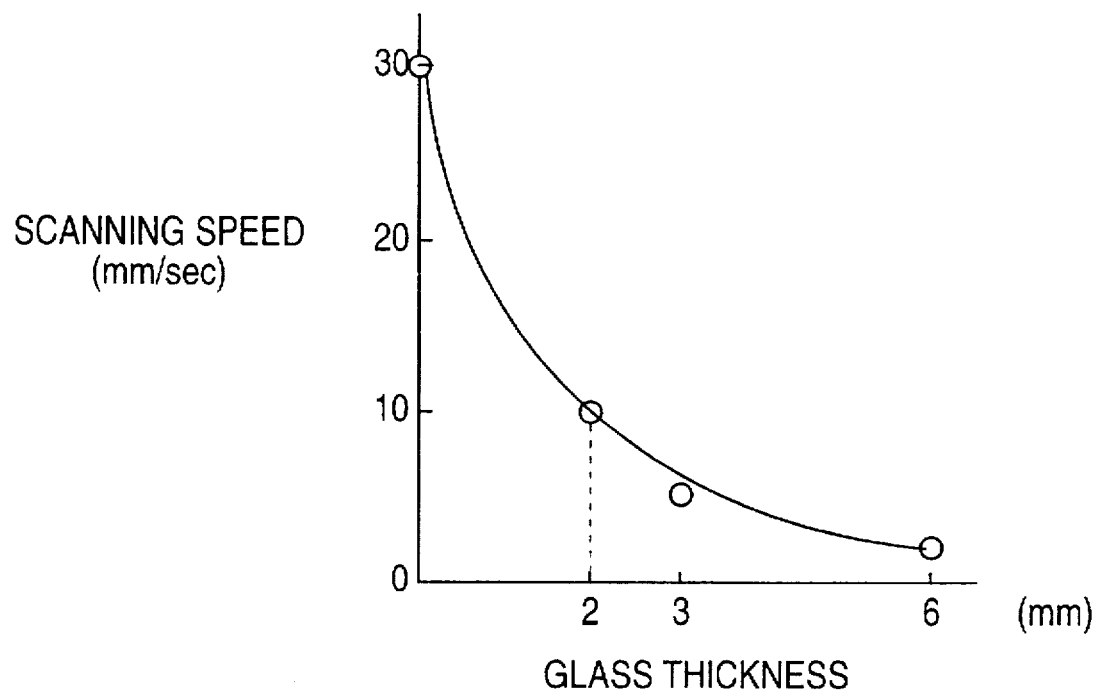
*FIG. 6(a)*       *FIG. 6(b)*
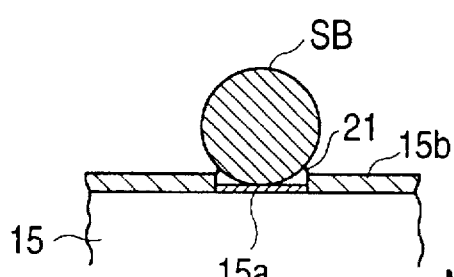 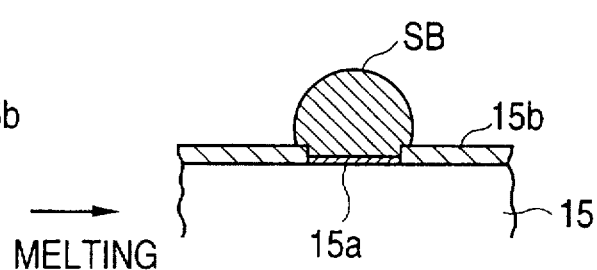

APPARATUS FOR FORMING SPHERICAL ELECTRODES

BACKGROUND OF THE INVENTION

1. Field of the Inention

The present invention relates to a method and an apparatus for forming spherical electrodes, each of which is shaped like a ball, on electrode pads provided on a semiconductor substrate, and, in particular, to a method and an apparatus for forming outer electrodes of a BGA (Ball Grid Array) type semiconductor package.

2. Description of the Related Art

In a conventional method for forming ball electrodes of a BGA type package, as shown in FIG. 7, an installation apparatus 1 formed of graphite material holds solder balls 2 by vacuum suction, and a fixing apparatus 5 holds a package 4 having pads 6 coated with soldering paste 3. In this method, the installation apparatus and the package 4 are aligned with each other, and the fixing apparatus 5 is fixed on the installation apparatus 1. These members are moved into a conveyor furnace (not shown), and the solder paste 3 is melted by heat processing. When the members are cooled, the soldering balls 2 are fixed to the pads 6.

However, the above conventional forming method has the following problems. For example, it cannot be confirmed whether or not the solder balls 2 are correctly aligned with the pads 6, since the installation apparatus 1 is formed of graphite which is an opaque material.

The solder balls 2 are held by vacuum suction on the taper portions 1b of the installation apparatus 1 which are located in a surface thereof, which are aligned with the pads 6 of the package 4, and which communicate with suction holes 1a (see FIG. 8). After the package 4 has been set, vacuum suction is no longer applied to the solder balls 2. In other words, the vacuum suction is performed while the solder balls 2 are held by the installation apparatus 1, and is stopped when the solder balls 2 are moved to the conveyor furnace. Thus, the solder balls 2 may move during the heat processing, and the positional precision of the solder balls 2 relative to the pads 6 decreases.

In addition, a method has been proposed in which the solder balls 2 are aligned with the pads 6 without the solder balls being held by vacuum, but are self-aligned due to surface tension of soldering paste. However, in this method, the solder balls again are not accurately aligned with the pads. Furthermore, it is difficult to keep the solder balls in the same plane since a package 4 may warp.

In the conventional method shown in FIG. 7, the installation apparatus 1 and the package 4 are aligned with each other, and the fixing apparatus 5 is fixed on the installation apparatus 1 so as not to move from a predetermined position. After the melted soldering paste 3 is cooled, the installation apparatus 1 and the fixing apparatus 5 are taken out of the conveyor furnace, and the package 4 is removed from the installation apparatus 1 and the fixing apparatus 5. The conventional method inevitably requires too much time and labor.

Moreover, in the conventional method, a large furnace and a long time are required to perform the heat processing and subsequent cooling. This is because the installation apparatus 1 and the fixing apparatus 5 having a great heat capacity are also heated and cooled along with the soldering paste when the soldering paste is heated and cooled in the conveyor furnace.

SUMMARY OF THE INVENTION

As mentioned above, the conventional method has some problems. First, it is impossible to confirm whether or not the solder balls and the pads are correctly aligned with each other. Second, attachment and detachment of the installation apparatus or the fixing apparatus require a lot of time and labor.

Further, massive facilities and much time are required to perform the heating and cooling process.

Therefore, the object of the present invention is to provide a spherical electrode forming method and a spherical electrode forming apparatus, having the following advantages: (1) Spherical members used as spherical electrodes and electrode pads provided on a semiconductor substrate are aligned with each other with high precision. (2) It can be easily confirmed whether or not the spherical members and the electrodes pads are aligned with each other with high precision. (3) The operation can be automatically performed, and the size of facilities required for performing the process is small by comparison. (4) Also, the time, cost and labor required for forming the spherical electrodes can be greatly decreased.

In order to achieve the above stated object, according to the present invention, a spherical electrode forming apparatus for forming spherical electrodes includes a plurality of spherical members each formed like a ball, and a holder for holding the spherical members by vacuum suction, the vacuum suction fixing the spherical members held by the holder to electrode pads provided on a semiconductor substrate. Further, in the spherical electrode forming apparatus, the holder is formed of a transparent material, so that the spherical members may be visible and thus carefully aligned.

In accordance with another aspect of the present invention, the spherical electrode forming apparatus of the present invention includes the holder for holding the spherical members by vacuum suction, each of which is formed in advance like a ball, the holder being formed of the transparent material, a mechanism for aligning the spherical members held by the holder with the electrode pads provided on the semiconductor substrate, with the spherical members and the electrode pads capable of being viewed through the transparent holder, and then bringing the spherical members into contact with fixing agent provided in advance on the electrode pads, and a heat source for melting the fixing agent, with which the spherical members are brought into contact, by transmitting heat through the holder.

In the spherical electrode forming method of the present invention, spherical members each formed in advance like a ball are held by vacuum suction in place by a holder formed of a transparent material. The spherical members held by the holder are aligned with electrode pads provided on a semiconductor substrate, with the spherical members and the electrode pads capable of being viewed through the transparent holder, and then the spherical members are brought into contact with fixing agent provided on the electrode pads on the semiconductor substrate. The fixing agent with which the spherical members are brought into contact are melted by heat transmitted from a heat source through the holder.

According to the present invention, by virtue of the aforementioned means, the spherical members could be aligned with the electrode pads. And the fixing agent to be melted on the electrode pads could be heated, with the spherical members being held by vacuum suction by the holder. Thus, the process can be performed with high accuracy, and the cost thereof can be decreased.

BRIEF DESCRIPTION OF THE DRAWINGS

The accompanying drawings, which are incorporated in and constitute a part of the specification are as follows:

FIG. 5 is a view which is used for explaining a relationship between a glass thickness of the installation apparatus for balls and a scanning speed of a light beam.

FIG. 6(a) is a cross-sectional view of a main portion before melting step, which is used for explaining another embodiment of the present invention.

FIG. 6(b) is a cross-sectional view of a main portion after melting step, which is used for explaining another embodiment of the present invention.

DETAILED DESCRIPTION OF THE PREFERRED EMBODIMENTS

Figure 1A:
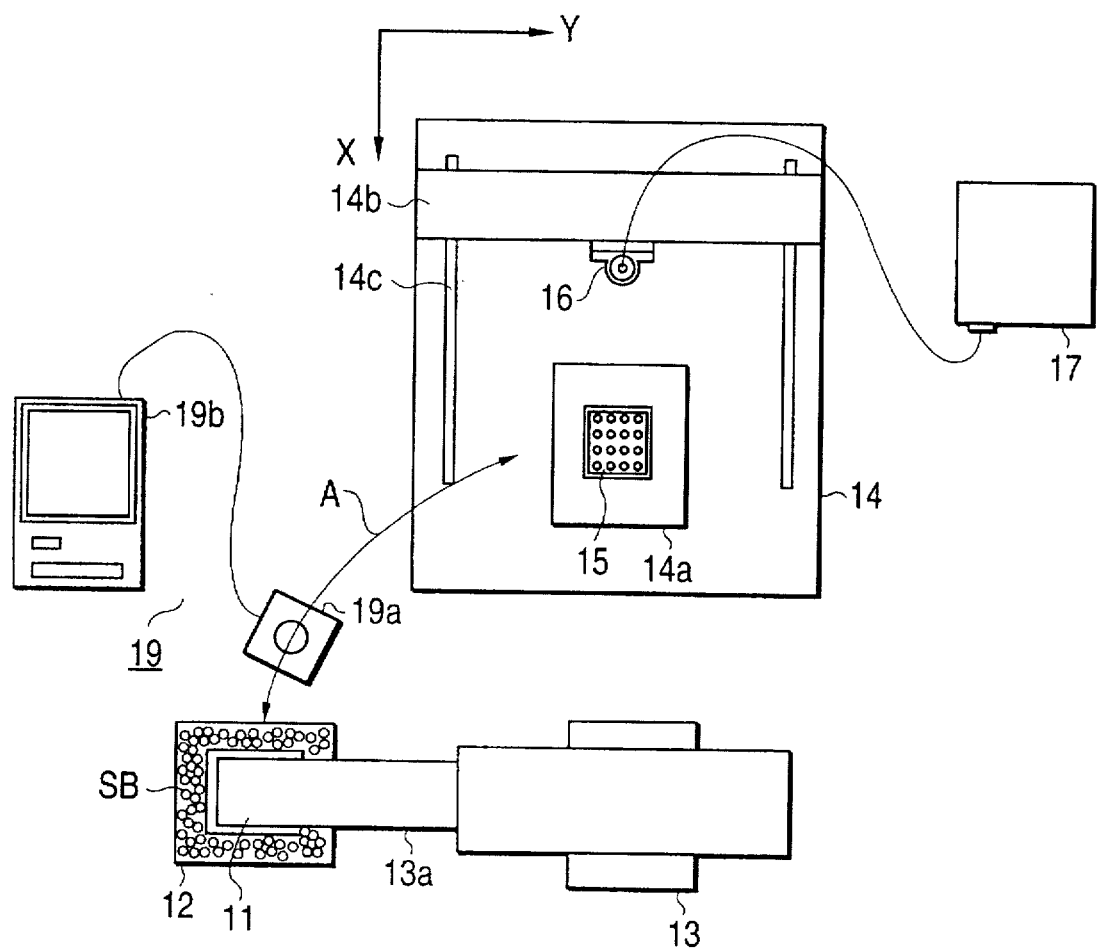
FIG. 1(a) is a schematic plan view showing a structure of a ball electrode forming apparatus relating to one embodiment of the present invention.
Figure 1B:
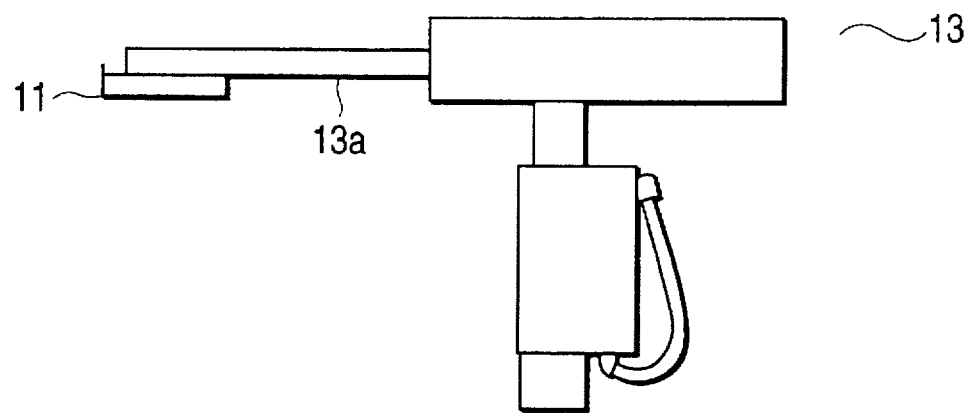
FIG. 1(b) is a schematic side view showing an installation apparatus and a cylindrical coordinates robot.
Figure 1C:
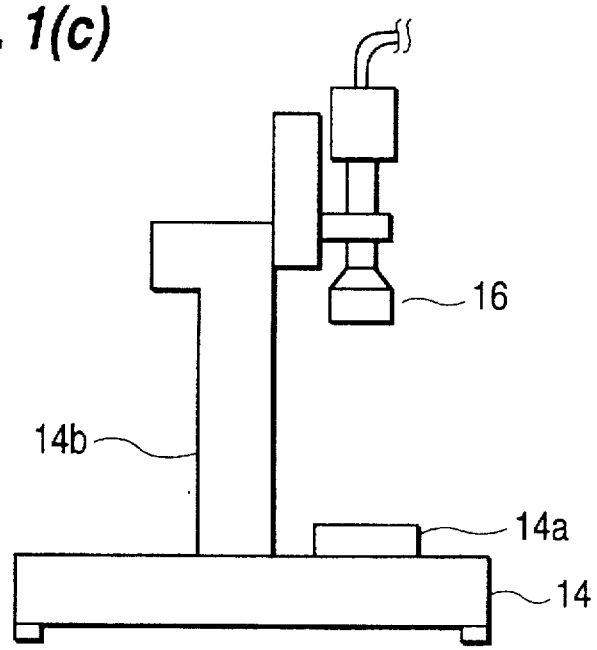
FIG. 1(c) is a schematic side view showing a rectangular coordinates robot and a light beam radiation light.

An embodiment of the present invention will be explained with reference to the drawings as follows:

FIG. 1(a) is a schematic top view showing a structure of a ball electrode forming apparatus of the present invention. FIG. 1(b) is a schematic side view. Similar reference elements are used throughout the following description to refer to similar elements.

An installation apparatus 11 for balls which serves as a holder vacuum-sucks and holds a predetermined number of solder balls SB (the predetermined number of solder balls SB in this embodiment is 16) of a larger plurality of said solder balls SB which are housed in advance in a ball vessel 12.

Figure 2A:
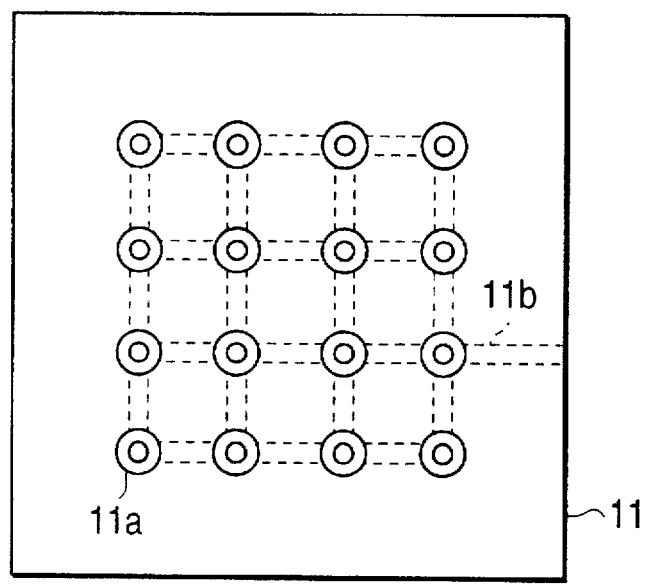
FIG. 2(a) is a schematic plan view showing an installation apparatus for balls in the embodiment of the present invention.
Figure 2B:
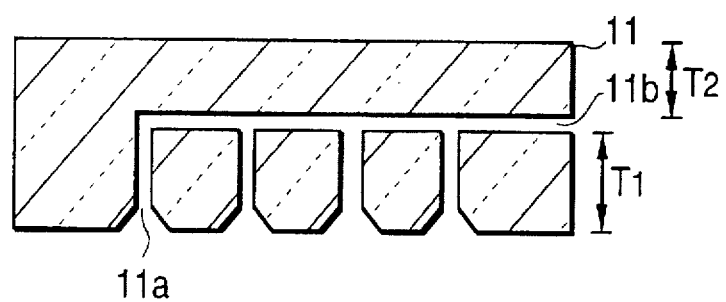
FIG. 2(b) is a schematic cross-sectional view showing an installation apparatus in the embodiment of the present invention.

According to the present invention, the installation apparatus 11 is formed of a transparent material, such as a heat resisting glass or quartz or other transparent material with similar characteristics, and, as shown in FIG. 2(a), has sixteen taper portions 11a and a supply path 11b. The taper portions 11a are for holding the solder balls SB. The supply path 11b is for use in supplying vacuum pressure which communicates with the taper portions 11a.

The taper portions 11a of the installation apparatus 11 correspond in position to outer electrodes formed on a BGA (Ball Grid Array) type semiconductor package described later, i.e. they correspond in position to electrode pads on which ball electrodes are to be formed. The thickness T1 between the bottom surface of the installation apparatus 11 and a bottom surface of the supply path 11b is about 2 mm. And the thickness T2 between the upper surface of the installation apparatus 11 and a top surface of the supply path 11b is approximately between 2 mm and 3 mm.

The installation apparatus 11 is provided at a distal end of an arm 13a of a cylindrical coordinates robot 13 such that the taper portions 11a face downwards. The cylindrical coordinates robot 13 rotates the arm 13a in a direction indicated by an arrow A in an X–Y plane, thereby controlling horizontal movement of the installation apparatus 11 between the ball vessel 12 and a rectangular coordinates robot 14.

Furthermore, the cylindrical coordinates robot 13 can control vertical movement of the arm 13a along a Z direction. Thus the robot 13 adjusts the distance between the installation apparatus 11 and the ball vessel 12 and the distance between the installation apparatus 11 and the rectangular coordinates robot 14.

The cylindrical coordinates robot 13 includes a vacuum supply device (not shown) for supplying vacuum pressure to the installation apparatus 11.

On the other hand, the ball vessel 12 includes a vibration mechanism (not shown) for vibrating a pan for supporting the solder balls SB.

When the solder balls SB are held by vacuum suction, the vibration mechanism gradually changes the positions of the solder balls SB by vibrating the ball vessel 12. At this time, vacuum pressure is applied to the installation apparatus 11. Then the solder balls SB are respectively sucked by the taper portions 11a, and supported in the respective positions.

The X-Y robot 14 includes a fixing apparatus 14a for a package, which sets a BGA type package 15, and an arm 14b movable in an X direction. The arm 14b can be freely moved along rails 14c.

The arm 14b includes a light beam radiation light (heat source) 16 for radiating a light beam onto the package 15 set on the package-holding installation apparatus 14a through the installation apparatus 11. The light beam radiation light 16 is provided in such a manner as to be movable in a direction where the arm 14b extends, i.e., in the Y direction of the package-holding installation apparatus 14a which is perpendicular to the direction the arm 14b is moved.

The light beam radiation light 16 includes a halogen lamp (not shown) for generating a light beam and a convex lens (not shown) for converging the light beam generated from the halogen lamp. The light 16 is provided by a light source 17 connected to the light beam radiation light 16.

Figure 3A:
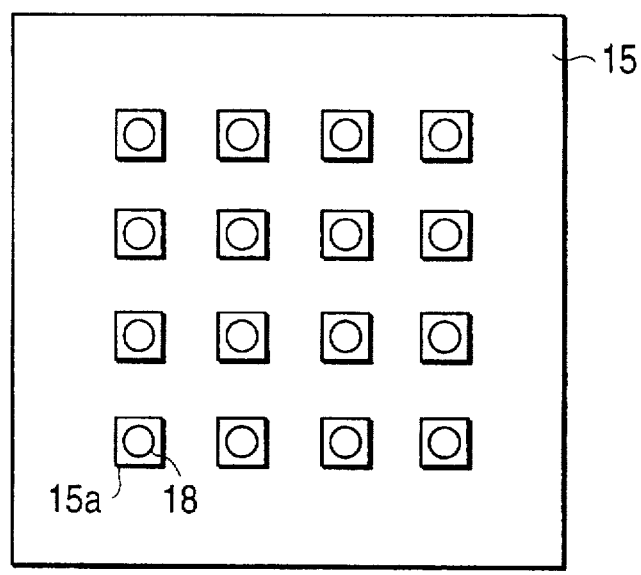
FIG. 3(a) is a schematic plan view showing an example of a package in the embodiment of the present invention.
Figure 3B:
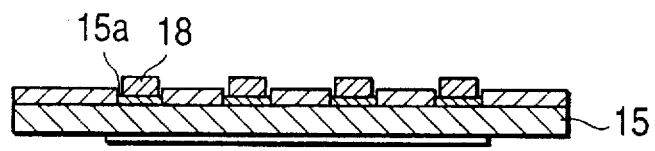
FIG. 3(b) is a schematic cross-sectional view showing an example of a package in the embodiment of the present invention.

The package 15 set on the package-holding installation apparatus is formed of a ceramic or glass-reinforced epoxy. As shown in FIG. 3(a), a plurality of electrode pads 15a (4×4=16 electrode pads are shown in this figure) are arranged on an upper surface of the package 15. And the electrode pads 15a are coated in advance with soldering paste 18 serving as a fixing agent.

The soldering paste 18 is heated and melted by the light beam from the light beam radiation light 16. Then, as the soldering paste 18 is cooled, the cooling fixes the electrode pads 15a provided on the package 15 and the solder balls SB supported by the installation apparatus 11 to each other.

An inspecting device 19 detects whether or not the solder balls SB are imperfectly held by vacuum suction on the taper portions 11a of the installation apparatus 11. The inspecting device 19 is provided midway in a movement path between the ball vessel 12 and the rectangular coordinates robot 14.

The inspecting device 19 may include: a camera 19a and an inspecting unit 19b. The camera 19a is for photographing an image of the installation apparatus 11 being rotated and moved, above the ball vessel 12. The inspecting unit 19b is for inspecting, by performing an image processing, whether or not the solder balls SB are supported by the taper portions 11a of the installation apparatus 11, on the basis of the image photographed by the camera 19a.

When the inspecting device 19 detects that the solder balls SB are imperfectly held by vacuum suction on the installation apparatus 11, the solder balls SB can be released. Then the solder balls SB are held by vacuum suction once again at the ball vessel 12. This operation is repeated until the solder balls SB are perfectly held by all the taper portions 11a of the installation apparatus 11.

Next, a ball electrode forming operation of the ball electrode forming apparatus will be explained as follows:

The installation apparatus 11 attached to the distal end of the arm 13a of the cylindrical coordinates robot 13 is moved to the ball vessel 12. Then, vacuum pressure is applied from the cylindrical coordinates robot 13 to the installation apparatus 11, after the distance between the installation apparatus 11 and the solder balls SB in the ball vessel 12 is adjusted.

At this time, the pan of the ball vessel 12 is vibrated, whereby some of the solder balls SB in the ball vessel 12 are held by vacuum suction on the taper portions 11a of the installation apparatus 11. In such a manner, the solder balls SB are held by vacuum suction on the taper portions 11a of the installation apparatus 11.

When the installation apparatus 11 perfectly holds the solder balls by vacuum suction, it continues to hold the solder balls SB under the vacuum pressure. The arm 13a of the cylindrical coordinates robot 13 is rotated and moved upwards, whereby the installation apparatus 11 is moved to the inspecting device 19. If the inspecting device 19 detects that the solder balls SB are imperfectly held by vacuum suction, the installation apparatus 11 is returned to the ball vessel 12. Then the solder balls SB are released, and after that the solder balls SB are held by vacuum suction once again.

When it is detected that the solder balls SB are perfectly held by all the taper portions 11a, the arm 13a of the cylindrical coordinates robot 13 is rotated and moved. Thereby the installation apparatus 11 is moved onto the package 15 set in the package-holding installation apparatus 14a located on the rectangular coordinates robot 14. Further, the arm 13a is moved downwards such that the installation apparatus 11 is stopped at a point at which the distance between the solder balls SB held by the installation apparatus 11 and the electrode pads 15a is about 2 mm.

Then, the position of each of the solder balls SB on the installation apparatus 11 relative to a corresponding one of the electrode pads 15a on the package 15 is confirmed by an operator from a point above the installation apparatus 11. And the installation apparatus 11 is moved downwards such that the solder balls SB on the installation apparatus 11 are brought into contact with the soldering paste 18 with which the electrode pads 15a are coated in advance.

Thereafter, the arm 14b of the rectangular coordinates robot 14 is moved along the rails 14c in the X-axis, and further the light beam radiation light 16 is moved along the arm 14b in the Y-axis. Thereby, the light beam radiation light 16 is moved to a point above the installation apparatus 11 located on the package 15.

The light beam radiation light 16 radiates a light beam, and simultaneously is moved, thereby successively scanning the electrode pads 15a on the package 15 with the light beam.

Figure 4:
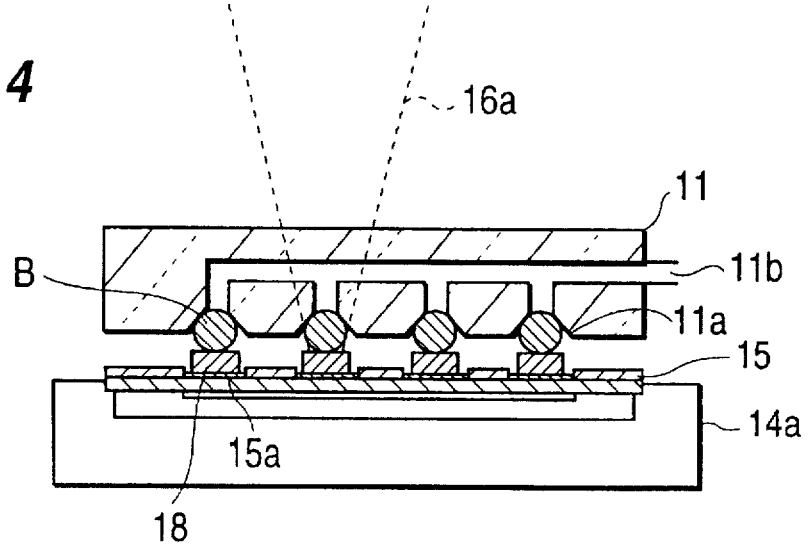
FIG. 4 is a cross-sectional view of a main portion, which is used for explaining a ball electrode forming operation, in the embodiment of the present invention.
Figure 7:
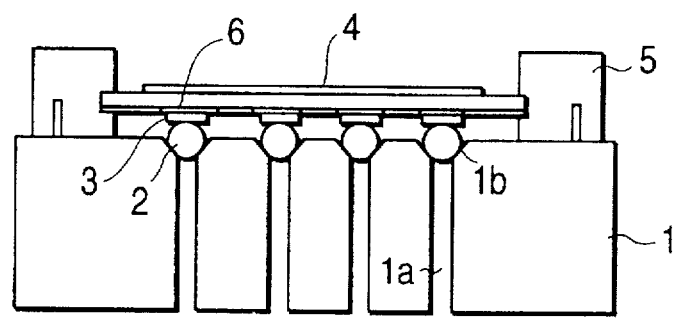
FIG. 7 is a cross-sectional view of a main portion of a ball electrode forming apparatus of the prior art, which is used for explaining the prior art and problems thereof.
Figure 8A:
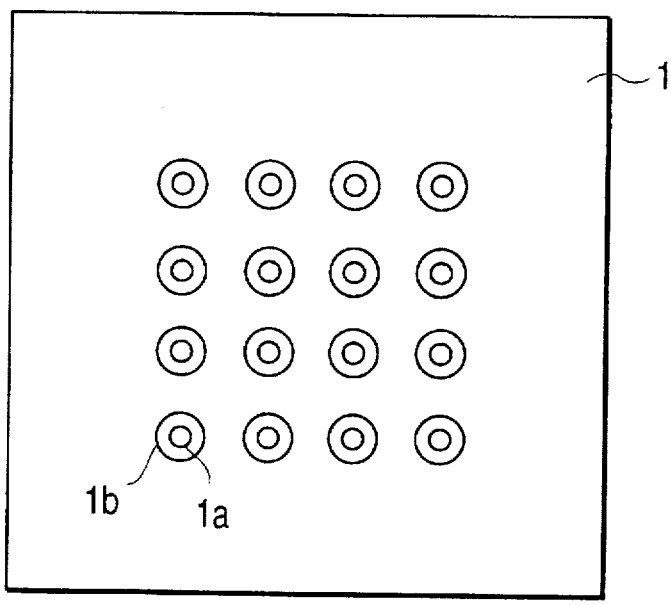
FIG. 8(a) is a schematic plan view showing a structure of an installation apparatus for balls which is used in the ball electrode forming apparatus of the conventional art.
Figure 8B:
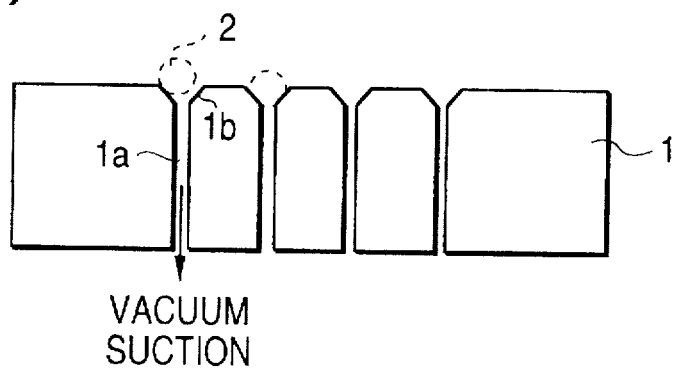
FIG. 8(b) is a schematic cross-sectional view showing a structure of an installation apparatus for balls which is used in the ball electrode forming apparatus of the conventional art.

In this case, as shown in FIG. 4, a light beam 16a is radiated from the light beam radiation light 16 onto the electrode pad 15a provided on the package 15 or the vicinity of the electrode pad 15a. Due to radiation of the light beam 16a, the soldering paste 18 on each of the electrode pads 15a is melted, and after a while, cooled and coagulated.

In such a manner, the soldering paste 18 once melted is cooled and coagulated, whereby the solder balls SB held by the installation apparatus 11 and the electrode pads 15a on the package 15 are fixed to each other. Thereby, ball electrodes are provided.

After the ball electrodes are provided, application of vacuum pressure from the cylindrical coordinates robot 13 to the installation apparatus 11 is stopped. And further the installation apparatus 11 is moved to the ball vessel 12 in order to form new ball electrodes.

FIG. 5 shows a relationship between the glass thickness of the installation apparatus 11 and the scanning speed of the light beam radiation light 16.

In this case, the glass thickness is the thickness of the portion of the installation apparatus 11 which is situated below the supply path 11b for use in supplying vacuum pressure. The other conditions necessary for forming the ball electrodes are shown by the following Table 1:

TABLE 1

| Solder Ball | composition: Sn (10%) + Pb (90%), solidus line: 268 centigrade liquids line: 292 centigrade |
|---|---|
| Soldering Paste | eutectic solder (Sn: 63%, PB: 37%) melting point: 183 centigrade |
| Output of Halogen Lamp | 150 W |
| Radiation Distance of Light Beam | 20 mm |
| Diameter of Light Beam | 0.5 mm |
| Scan Pitch of Light Beam | 5 mm |
| Preheat | 100 centigrade, one minute (hot air) |
| Wave Length of Light Beam | 400 to 4500 nm |

Specifically, in the case where the package 15 is coated with the soldering paste 18 whose thickness is about 150 microns, in order to compensate for a warp of about 100 microns of the package 15. And the solder balls SB each of which has a diameter of 0.7 mm are fixed at a pitch of 1.5 mm, under the conditions shown in the above table 1. When the glass thickness is 2 mm, the ball electrodes can be formed at a scanning speed of about 10 mm/sec, and when the glass thickness is 3 mm, the ball electrodes can be formed at a scanning speed of about 4 mm/sec. Further, when the glass thickness is 6 mm, the ball electrodes can be formed at a scanning speed of about 1 mm/sec. The thicker the glass, the less light is transmitted through the glass. So, the scanning speed is in inverse proportion to the glass thickness.

In this case, a light beam whose diameter is 0.5 mm is radiated. Similarly, in the case where a light beam having a smaller diameter is radiated, it is preferable that the installation apparatus 11 be formed to have a thickness of about 2 mm.

In the apparatus having the above structure, the solder balls SB held by the installation apparatus 11 and the electrode pads provided on the package 15 can be aligned with each other, with the solder balls SB and the electrode pads being viewed directly by the naked eye. The solder balls SB are held by vacuum suction by the installation apparatus 11 until the solder balls SB are fixed to the electrode pads 15a. Therefore, the solder balls SB and the electrode pads 15a can be fixed to each other with high accuracy. Divergence corresponding to 20% of the pad pitch in the prior art can be decreased to 5% or less according to the present invention.

Further, only the vicinity of the soldering paste 18 is heated and melted for a short period of time. As a result of this the need for an increase in temperature of each of the packages is small, and the temperature of each package can be quickly returned to room temperature. Thus, the time required for cooling each package is short. Thus, automatic transmission of the packages can be easily realized, and the packages can be sequentially transmitted to the next step.

Moreover, it is not necessary that attachment and detachment of the installation apparatus be performed by the operator. The ball electrodes can be automatically formed, and a cost reduction can be easily attained.

In the above embodiment, we have explained the case where the solder balls are fixed by use of a soldering paste (for example, eutectic solder). However, the method for fixing the solder balls is not so limited. For example, as shown in FIG. 6(a) and FIG. 6(b), the electrode pads 15a provided on the package 15 and the solder balls SB may be fixed to each other by use of flux organic acid SB 21. In this case, a bottom portion of each of the solder balls SB is melted and spreads on the entire surface of each of the electrode pads 15a exposed to a surface of a solder resist 15b. However, each solder ball SB is shaped circularly due to its surface tension. Therefore, in the case of using the flux, the ball electrodes can be formed as in the case of using the soldering paste.

A material the composition of which differs from that of solder can be used in the solder ball, if the melting point of the material is higher than that of solder used in the solder ball. Further, a ball may be formed of metal in order that the ball hardly melts even by soldering, like iron-nickel copper or copper alloy, or the surface of the ball may be plated with an easily melting soldering material, such as solder, tin, or noble metal.

A halogen lamp, a xenon lamp, a laser or the like can be used as the heat source.

Even if the installation apparatus for the balls does not have the tapered portions, the balls are held by the installation apparatus. Further, the installation apparatus can be formed of a material such as quartz, other than a heat resisting glass as suggested earlier.

Further, the present invention can have the following structure:

The package holding installation apparatus for the package is mounted on a X-Y coordinates stage, and the package is freely moved and the light beam fixed, instead of the package being fixed and scanned with a moving light beam.

Furthermore, it is preferable to the automatic operation that alignment of the electrode pads and the solder balls be performed optically by utilizing image processing rather than operator (human) viewing.

Moreover, after the electrode pads are coated by the soldering paste, if the paste is preheated by blowing hot air, a solvent contained in the flux volatilizes. After that the electrode pads and the solder balls are preferably fixed to each other. Also, the similar effect can be obtained when preheating is performed by using a heat block.

In the embodiment, the installation apparatus 13 is an EPSON Accusembler Model C903-CL available from Seiko-Epson Corporation, the rectangular coordinates robot 14 is a HAKKO Robot Station 966, and the light beam radiation light 16 is a HAKKO Soldering High Beam 960, 963 available from Hakko Corporation. And also other equivalent machines could be used having similar performance to the above machines.

Various modifications may be made without departing from the scope of the general inventive concept as defined by the claims.

What is claimed is:

1. An apparatus for forming spherical shaped electrode elements, comprising:

a holder for holding the spherical shaped electrode elements arranged in the form of ball-like electrodes by vacuum suction, the holder being formed of a transparent material;

a mechanism for aligning the spherical shaped electrode elements when held by the holder with electrode pads provided on a semiconductor substrate, the spherical shaped electrode elements when held by the holder and the electrode pads being viewed through the holder, and the mechanism for bringing the spherical shaped electrode elements when held by the holder into contact with a fixing agent applied to the electrode pads provided on the semiconductor substrate; and a heat source for melting the fixing agent, by transmitting heat to the fixing agent through the holder when the spherical shaped electrode elements contact the fixing agent.

2. The apparatus according to claim 1, wherein the holder includes means for continuously holding the spherical shaped electrode elements by vacuum suction until the spherical shaped electrode elements have become fixed to the electrode pads.

3. The apparatus according to claim 1, wherein the heat source includes means for directing heat only to the fixing agent and in the vicinity of the fixing agent.

4. The apparatus according to claim 1, wherein the holder includes a plurality of taper portions on a bottom surface and a supply path connected to the taper portions, each of the taper portions being connected to the spherical shaped electrode elements when held by the holder.

5. The apparatus according to claim 4, wherein the thickness between the bottom surface of the holder and a bottom surface of the supply path is about 2 mm, and the thickness between the upper surface of the holder and a top surface of the supply path is approximately between 2 mm and 3 mm.

6. The apparatus according to claim 1, wherein the holder is made of heat resisting glass.

7. The apparatus according to claim 1, wherein the holder is made of quartz.

* * * * *